United States Patent
Metz et al.

(10) Patent No.: US 8,021,940 B2
(45) Date of Patent: Sep. 20, 2011

(54) METHODS FOR FABRICATING PMOS METAL GATE STRUCTURES

(75) Inventors: Matthew V. Metz, Hillsboro, OR (US);
Mark L. Doczy, Meridian, ID (US);
Gilbert Dewey, Hillsboro, OR (US);
Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 135 days.

(21) Appl. No.: 11/968,099

(22) Filed: Dec. 31, 2007

(65) Prior Publication Data

US 2009/0166769 A1    Jul. 2, 2009

(51) Int. Cl.
*H01L 21/8238* (2006.01)

(52) U.S. Cl. ............... 438/199; 438/592; 257/E21.297

(58) Field of Classification Search .......... 438/199, 438/216, 287, 275, 591, 592; 257/E21.297
See application file for complete search history.

(56) References Cited

U.S. PATENT DOCUMENTS

| | | | |
|---|---|---|---|
| 7,148,145 B2 | 12/2006 | Wieczorek et al. | |
| 7,524,727 B2 | 4/2009 | Dewey et al. | |
| 2002/0104994 A1 | 8/2002 | Shih | |
| 2002/0123212 A1* | 9/2002 | Kunikiyo | 438/585 |
| 2004/0048472 A1 | 3/2004 | Wieczorek et al. | |
| 2005/0186790 A1* | 8/2005 | Kirby et al. | 438/667 |
| 2006/0134870 A1* | 6/2006 | Luan et al. | 438/287 |
| 2006/0153995 A1* | 7/2006 | Narwankar et al. | 427/569 |
| 2007/0131972 A1* | 6/2007 | Li | 257/213 |
| 2007/0152271 A1 | 7/2007 | Dewey et al. | |

FOREIGN PATENT DOCUMENTS

| | | |
|---|---|---|
| WO | 2009/088588 A2 | 7/2009 |
| WO | 2009/088588 A3 | 9/2009 |

OTHER PUBLICATIONS

International Search Report and Written Opinion received for PCT Patent Application No. PCT/US2008/085249, mailed on Jul. 15, 2009, 10 pages.
International Preliminary Report on Patentability received for PCT Patent Application No. PCT/US2008/085249, mailed on Jul. 15, 2010, 6 pages.

* cited by examiner

*Primary Examiner* — Thanhha Pham
(74) *Attorney, Agent, or Firm* — Kathy J. Ortiz

(57) ABSTRACT

Methods of forming a microelectronic structure are described. Those methods may include forming a gate dielectric layer on a substrate, forming a metal gate layer on the gate dielectric layer, and then forming a polysilicon layer on the metal gate layer in situ, wherein the metal gate layer is not exposed to air.

15 Claims, 5 Drawing Sheets

US 8,021,940 B2

METHODS FOR FABRICATING PMOS METAL GATE STRUCTURES

BACKGROUND OF THE INVENTION

Microelectronic devices are often manufactured in and on silicon wafers and on other types other substrates. Such integrated circuits may include millions of transistors, such as metal oxide semiconductor (MOS) field effect transistors, as are well known in the art. The MOSFET may comprise a gate structure, such as a metal and/or a polysilicon gate structure, as are known in the art.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
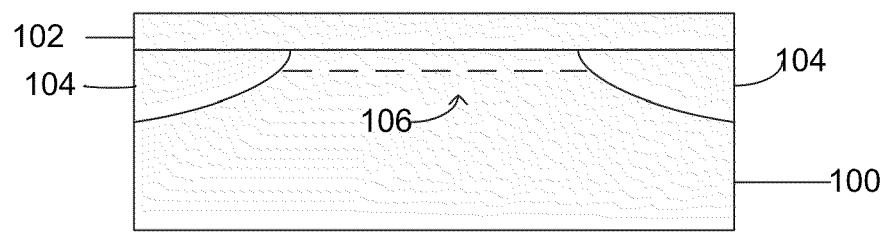
FIGS. 1a-1f represent structures according to embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic device are described. Those methods may include forming a gate oxide on a substrate, forming a metal gate layer on the gate oxide, and then forming a polysilicon layer on the metal gate layer in situ, wherein the metal gate layer is not exposed to air. Methods of the present invention enable simpler integration with high temperature metal PMOS metal gates.

FIGS. 1a-1f illustrate embodiments of the present invention. FIG. 1a illustrates a cross-section of a portion of a substrate 100 that may comprise a P type silicon substrate 100 in some embodiments, and may comprise a portion of a P channel for a metal oxide semiconductor (MOS). The silicon substrate 100 may be comprised of materials such as, but not limited to, silicon, silicon-on-insulator, germanium, indium antimonide, lead telluride, indium arsenide, indium phosphide, gallium arsenide, gallium antimonide, or combinations thereof. The substrate 100 may further comprise source drain regions 104 and a channel region 106.

A gate dielectric layer 102 may be disposed on the substrate 100. The gate dielectric layer 102 may comprises a high-k gate dielectric layer 102. Some of the materials that may be used to make high-k gate dielectric layer 102 may include: hafnium oxide, zirconium oxide, titanium oxide, and aluminum oxide. Although a few examples of materials that may comprise the gate dielectric layer 102 are described here, that layer may be made from other high-k gate dielectric materials according to the particular application.

Figure 1B:
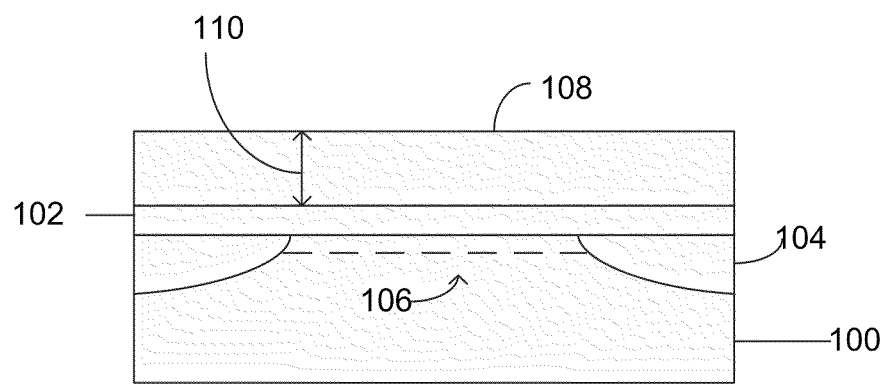

A metal gate layer 108 may be formed on the gate dielectric layer 102 (FIG. 1b). In one embodiment, the metal gate layer 108 may comprise at least one of tantalum nitride, titanium nitride, zirconium nitride, and hafnium nitride, tantalum carbide, hafnium carbide and zirconium carbide. The metal gate layer 108 may comprise a material that possesses a melting point greater than about 800 degrees Celsius. In one embodiment, the metal gate layer 108 may be formed using an ALD (Atomic Layer Deposition) process. In one embodiment, the ALD process may be performed in a multi-chamber tool system, as are known in the art, which may comprise a metal gate layer formation chamber and a polysilicon formation chamber, for example.

In one embodiment, the metal gate layer 108 may be formed at a pressure of about 0.5 to about 1.5 Torr, a temperature of about 150 to about 300 degrees Celsius, a nitrogen flow rate of about 1.5 to about 2.5 SLM, an NH3 flow rate of about 350 to about 450 sccm, and a TDMAT (please spell out) flow rate of about 75 to about 150 sccm. In one embodiment, the TDMAT may be pulsed with nitrogen followed by a nitrogen purge, and then NH3 and nitrogen may be pulsed, followed by a nitrogen purge. Such a cycle may be repeated according to the particular application.

In one embodiment, the metal gate layer 108 that is disposed on the substrate 100 may be kept in the ALD deposition tool under vacuum after the formation of the metal gate layer 108, and may not be exposed to air (i.e. may not be exposed to a pressure greater than about 50 Torr). The metal gate layer 108 may comprise a thickness 110 of about 75 angstroms or greater in some applications.

The metal gate layer 108 may preferably comprise a PMOS metal gate layer 108, that is, the metal gate layer 108 may comprise a suitable work function value for operation in a PMOS portion of microelectronic device. For example, the metal gate layer 106 may preferably comprise a work function value that is compatible with a PMOS gate electrode (which typically comprises a work function value of about 4.8-5.1 electron volts).

Figure 1C:
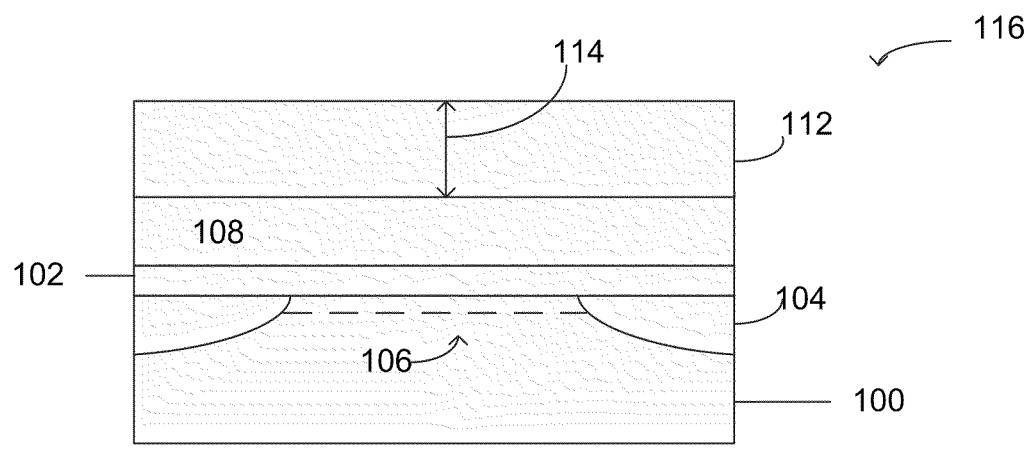

A substantially amorphous polysilicon layer 112 may be formed on the metal gate layer 108 in situ, without exposing the metal gate layer 108 to air, to form a portion of a transistor structure, such as a portion of a PMOS transistor structure 116 (FIG. 1c). In one embodiment, the metal gate layer 108 disposed on the substrate 100 (that may comprise a silicon wafer in some embodiments) may be moved from the metal gate layer formation chamber within the multi-chamber deposition tool to the polysilicon formation chamber while maintaining a pressure in the deposition tool below about 30 Torr).

The amorphous polysilicon layer 112 may provide a cap for the metal gate layer 108, wherein the metal gate layer 108 may comprise less moisture, oxygen, and hydrogen than the metal gate layer 108 may comprise if not so capped by the amorphous polysilicon layer 112. In one embodiment, about 1 percent to about 0 percent oxygen may be present in the metal gate layer with the use of the amorphous polysilicon layer 112.

In one embodiment, the amorphous polysilicon layer 112 may be formed at a pressure of about 10-20 Torr, a temperature of about 500 to about 600 degrees Celsius, a flow rate of about 300 to about 500 sccm of disilane, and a flow rate of about 1- to about 20 sccm of nitrogen gas. The particular process parameters will vary depending upon the particular application. In one embodiment, the amorphous polysilicon layer 112 may comprise less than about 20 percent oxygen.

By forming the amorphous polysilicon layer 112 on the metal gate layer 108 in situ, much less oxygen will be formed within the amorphous polysilicon layer 112 than if the amorphous polysilicon layer 112 was formed ex situ (formed after the metal gate layer 108 is exposed to air. For example, an ex situ polysilicon film may contain greater than about 25 percent oxygen. In one embodiment, the amorphous polysilicon layer 112 may comprise a thickness 114 of about 100 angstroms or greater.

Figure 1D:
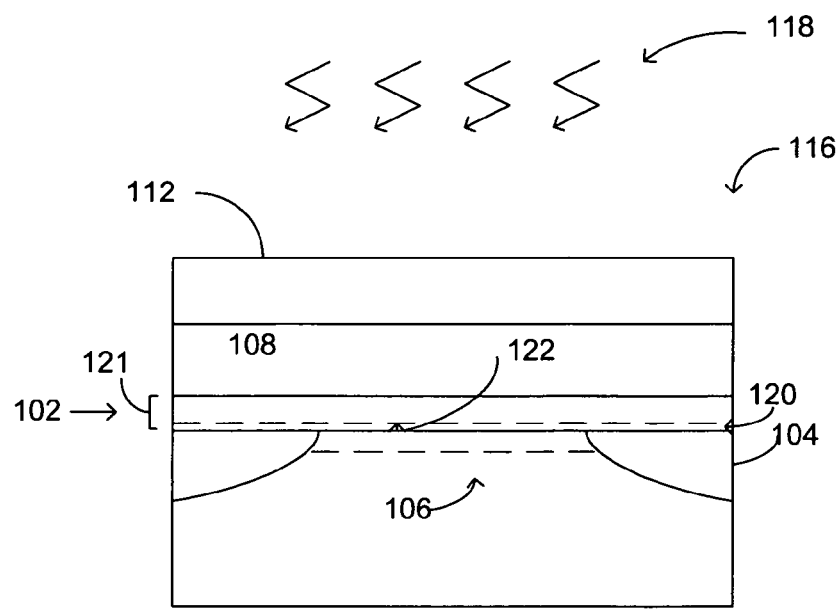

In one embodiment, the portion of the PMOS transistor structure 116 may be exposed to an anneal process 118 (FIG. 1d). The anneal process 118 may comprise any type of process that provides sufficient energy to activate the source/drain regions 112, and may comprise a temperature of about 800 degrees to about 1100 degrees Celsius. The particular process parameters will vary depending upon the particular application. Because the metal gate layer 108 may comprises a relatively high melting point (greater than about 800 degrees Celsius) the metal gate layer 108 may withstand the anneal process 188 without melting and/or exhibiting degradation of device performance of the transistor structure 116.

A transition layer oxide 120 may be formed beneath the high k gate oxide during the anneal, and may comprise a thickness 122 of about 3-9 angstroms in some embodiments. In one embodiment, a total electrical oxide thickness 121 may comprise the transition layer oxide 120, the high K gate oxide thickness plus a quantum mechanical oxide portion (not shown), and may comprise a total electrical thickness of about 14 angstrom or less. The thickness 122 of the transition layer oxide 120 may comprise a lower thickness (which may be about 3-5 angstroms lower in some embodiments) than a transition layer oxide that may form with an ex-situ polysilicon layer formed on the metal gate layer 108. Thus, the in-situ capping of the metal gate layer 108 by the amorphous polysilicon layer 112 may reduce the thickness of the transition layer oxide 120 and consequently the total electrical oxide thickness 121.

Figure 1E:
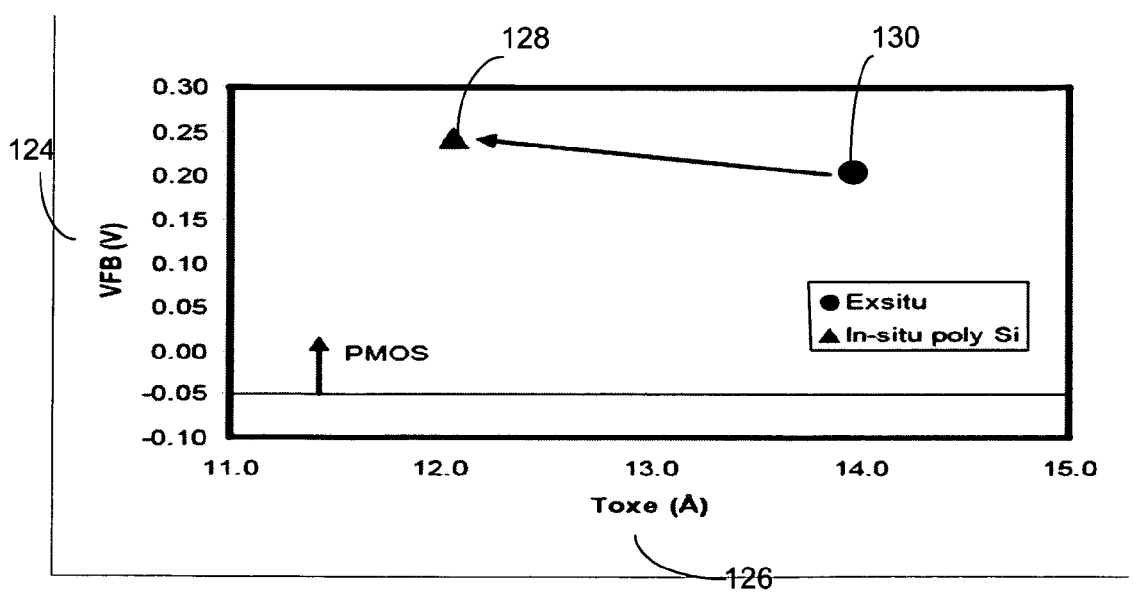

FIG. 1e depicts a flat band voltage 124 for a transistor structure (such as the PMOS transistor structure 116 of FIG. 1d, for example) as a function of an electrical oxide thickness 126 for in situ polysilicon 128 and ex-situ polysilicon 130. The flatband voltage 124 for the in situ polysilicon 128 is about 0.25 volts at about 12 angstroms inversion thin oxide thickness 126, whereas the flatband voltage 124 for the ex situ polysilicon 130 is about 0.20 volts at about 14 angstroms inversion thin oxide thickness 126. Thus, the flatband voltage 124 for the in situ polysilicon 126 is greater than about 0 volts relative to P type silicon with an inversion thin oxide thickness 126 of about 12 angstroms, less than that for the ex situ polysilicon 130.

Figure 1F:
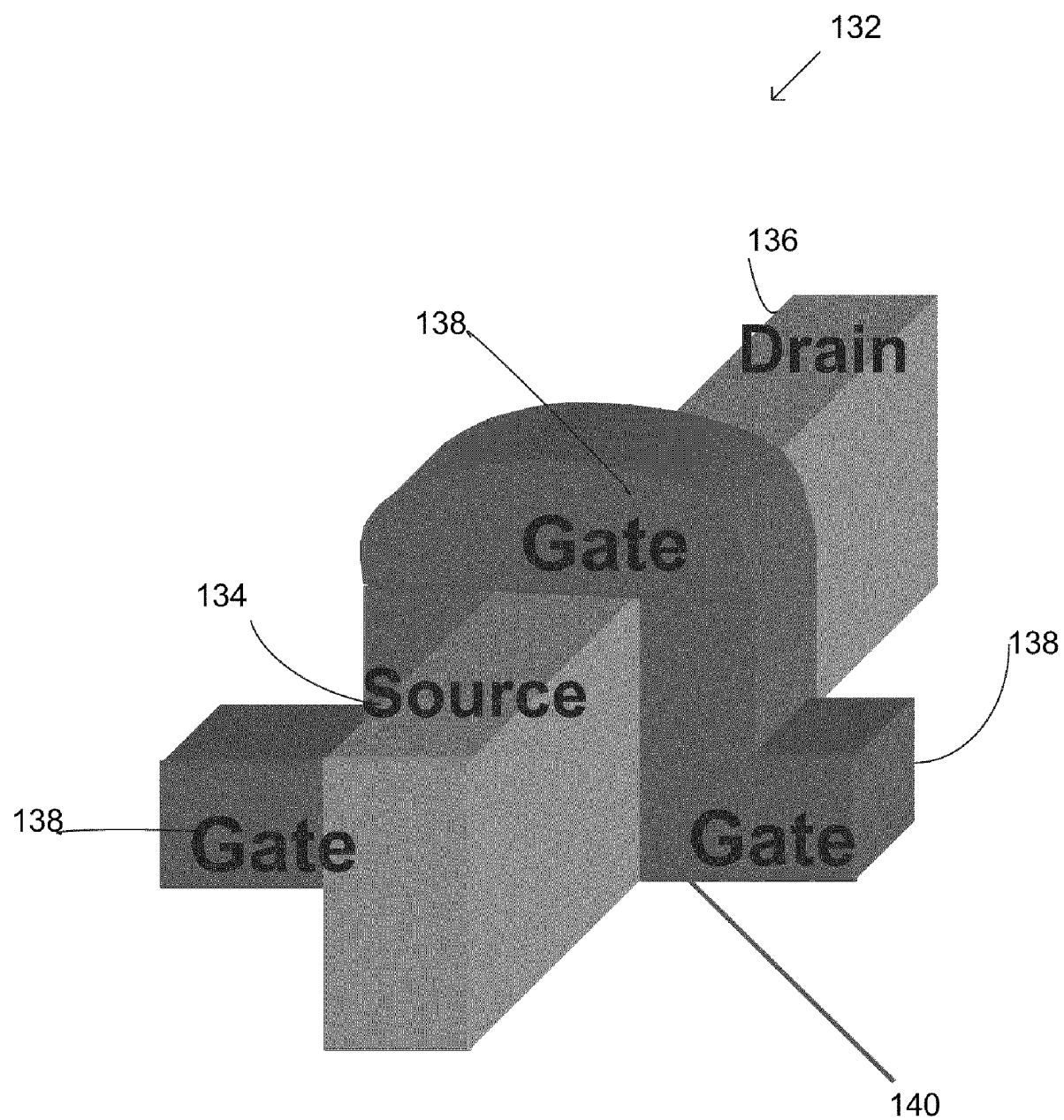

FIG. 1f depicts a portion of a trigate transistor structure 132, comprising a trigate source region 134, a trigate drain region 136 and trigate gate regions 138. Some features of the trigate transistor structure 132, such as, for example, a sidewall region 140 wherein the trigate source region 134 and a trigate gate region 138 may meet, may be more easily filled/covered with a metal gate material by using embodiments of the present invention (such as ALD deposition as compared with sputtering process, for example) than with prior art processes utilizing replacement metal gate process, for example.

Figure 2:
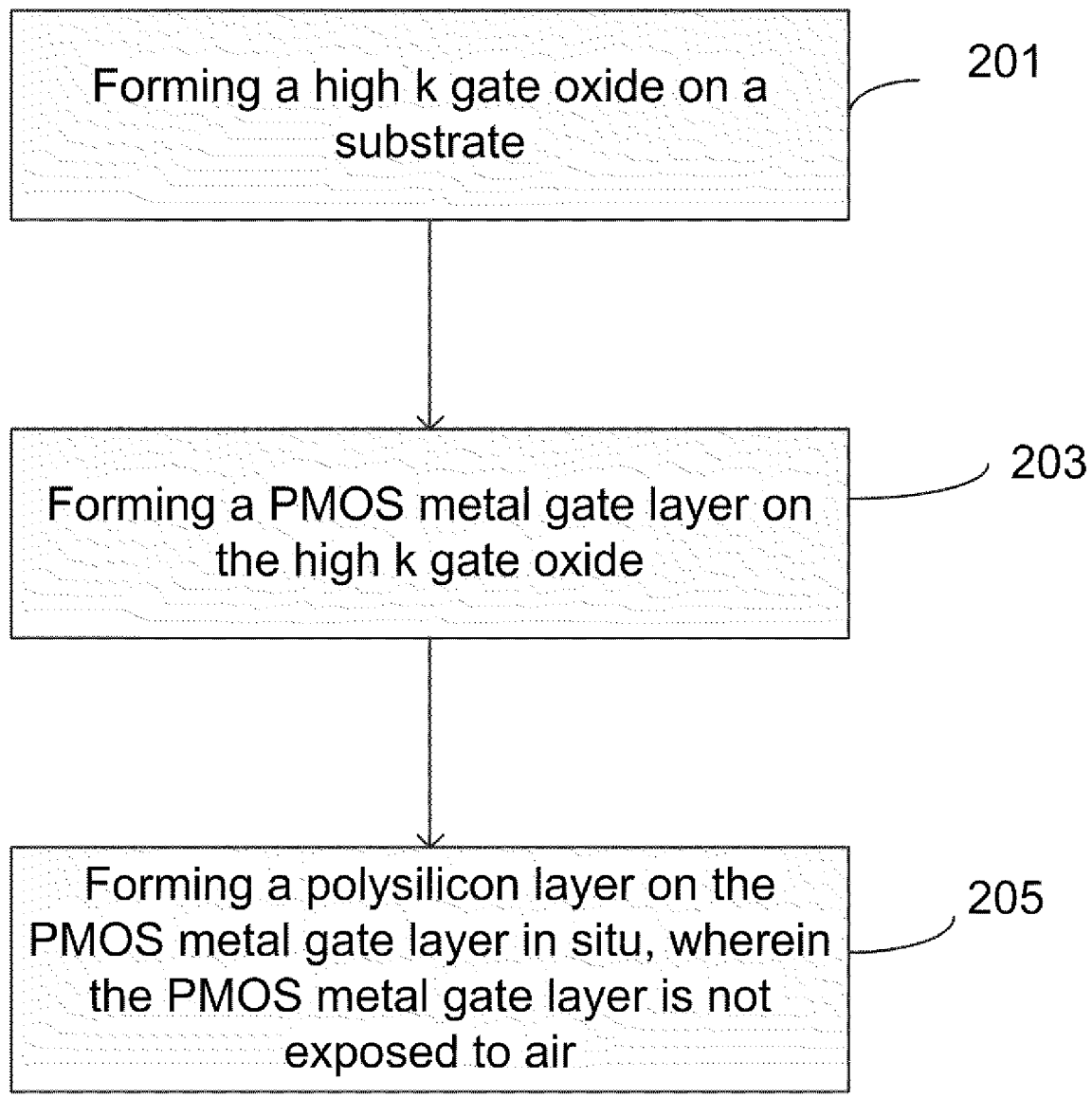
FIG. 2 represents a flow chart according to an embodiment of the present invention.

FIG. 2 depicts a flow chart according to an embodiment of the present invention. At step 201, a high k gate oxide may be formed on a substrate. At step 203, a PMOS metal gate layer may be formed on the high k gate oxide. At step 205, a polysilicon layer may be formed on the PMOS metal gate layer in situ, wherein the PMOS metal gate layer is not exposed to air.

Figure 3:
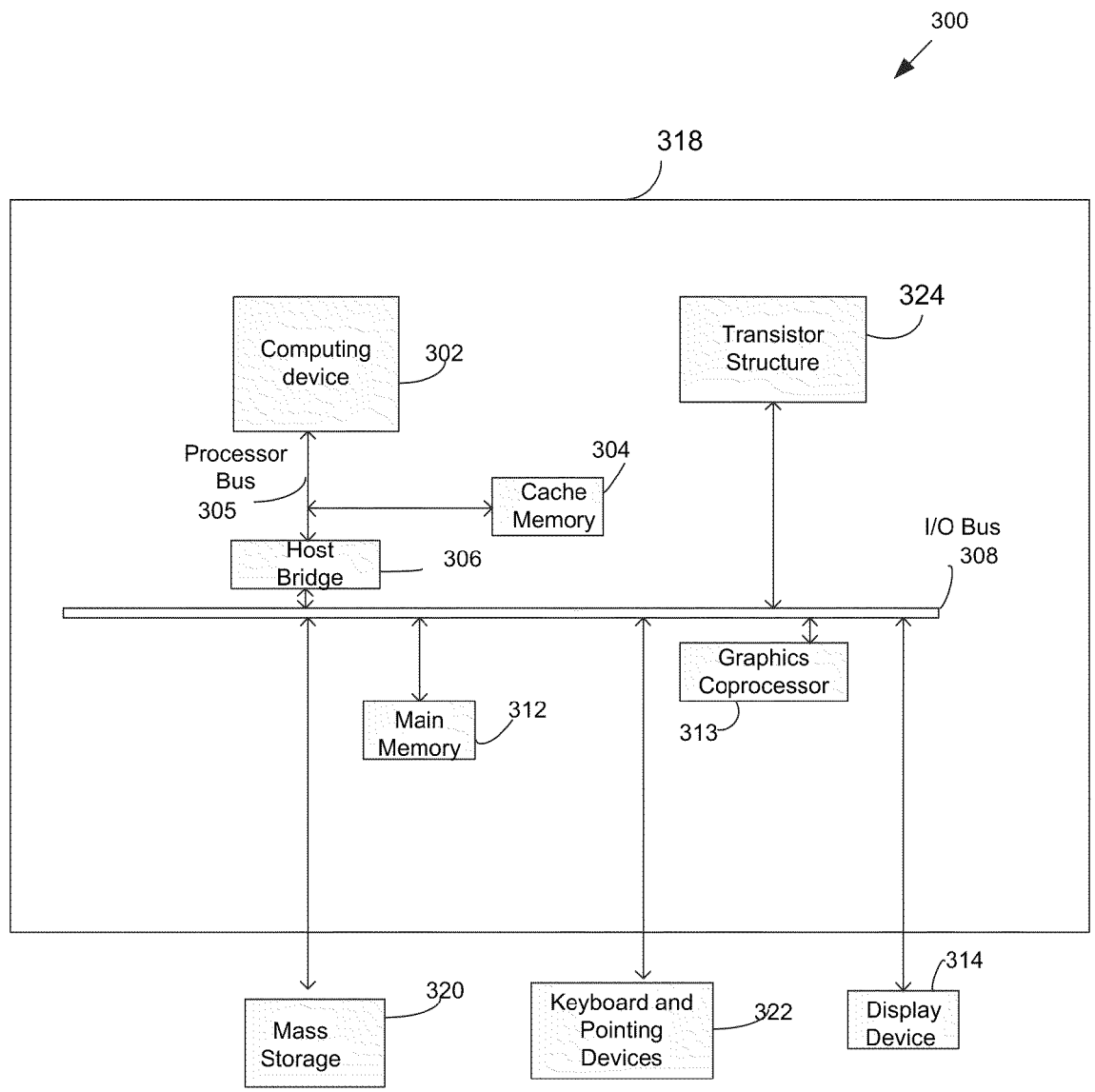
FIG. 3 represents a system according to embodiments of the present invention.

FIG. 3 depicts a diagram illustrating an exemplary system 300 capable of being operated with methods for fabricating a microelectronic structure, such as the transistor structure 116 of FIG. 1d, for example. It will be understood that the present embodiment is but one of many possible systems in which the transistor structures of the present invention may be used.

In the system 300, the transistor structure 324 may be communicatively coupled to a printed circuit board (PCB) 318 by way of an I/O bus 308. The communicative coupling of the transistor structure 324 may be established by physical means, such as through the use of a package and/or a socket connection to mount the transistor structure 324 to the PCB 318 (for example by the use of a chip package, interposer and/or a land grid array socket). The transistor structure 324 may also be communicatively coupled to the PCB 318 through various wireless means (for example, without the use of a physical connection to the PCB), as are well known in the art.

The system 300 may include a computing device 302, such as a processor, and a cache memory 304 communicatively coupled to each other through a processor bus 305. In one embodiment, the computing device 302 may comprise at least one transistor structure. The processor bus 305 and the I/O bus 308 may be bridged by a host bridge 306. Communicatively coupled to the I/O bus 308 and also to the transistor structure 324 may be a main memory 312. Examples of the main memory 312 may include, but are not limited to, static random access memory (SRAM) and/or dynamic random access memory (DRAM), and/or some other state preserving mediums. In one embodiment, the main memory 312 may comprise at least one transistor structure. The system 300 may also include a graphics coprocessor 313, however incorporation of the graphics coprocessor 313 into the system 300 is not necessary to the operation of the system 300. Coupled to the I/O bus 308 may also, for example, be a display device 314, a mass storage device 320, and keyboard and pointing devices 322. In one embodiment, the mass storage device 320 may comprise at least one transistor structure.

These elements perform their conventional functions well known in the art. In particular, mass storage 320 may be used to provide long-term storage for the executable instructions for a method for forming and/or utilizing transistor structures in accordance with embodiments of the present invention, whereas main memory 312 may be used to store on a shorter term basis the executable instructions of a method for forming and/or utilizing transistor structures in accordance with embodiments of the present invention during execution by computing device 302. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 312 may supply the computing device 302 (which may be a processor, for example) with the executable instructions for execution.

Thus, the methods of the present invention enable the formation of high temperature PMOS metal gates for use with high-K dielectrics that may survive high temperature processing. Benefits of the present invention include enabling of device scaling and metal gate fabrication without the use of a replacement metal gate process for PMOS channel structures. The subtractive (high-temperature compliant) based integration of metal gate electrodes is enabled. Complex tri-gate integration is achieved without the need for replacement metal gate processes. The novel in-situ stack of the present invention significantly reduces oxidation below the high-K layer. This enables high temperature PMOS metal gate with concomitant electrical inversion oxide thickness (Toxe) of below about 14 Å. Replacement metal gate process flow has been used in prior art processes to achieve below 14 Å Tox, but this requires avoidance of placing the metal on the gate stack prior to anneal, thus increasing process complexity.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that a microelectronic device, such as a transistor is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
   forming a gate dielectric layer on a substrate, wherein the substrate comprises source/drain regions;
   forming a metal gate layer on the gate dielectric layer, wherein the metal gate layer comprises less than about 1 percent oxygen; and
   forming a polysilicon layer on the metal gate layer in situ, wherein the metal gate layer is not exposed to air, wherein the polysilicon layer is undoped.

2. The method of claim 1 further comprising wherein the metal gate layer comprises a work function from about 4.8 electron volts to about 5.1 electron volts.

3. The method of claim 1 further comprising wherein the metal gate layer comprises at least one of tantalum nitride, titanium nitride, zirconium nitride, hafnium nitride, tantalum carbide, hafnium carbide and zirconium carbide.

4. The method of claim 1 further comprising wherein the polysilicon layer comprises a substantially amorphous polysilicon layer.

5. The method of claim 4 further comprising wherein the amorphous polysilicon layer comprises less than about 20 percent oxygen.

6. The method of claim 1 further comprising annealing the source/drain regions disposed within the substrate at a temperature of about 800 to about 1100 degrees Celsius.

7. The method of claim 1 wherein forming the metal gate layer comprises forming a layer of TiN using an ALD process.

8. The method of claim 7 wherein the TiN layer is formed using TDMAT and NH3 gases at a temperature of about 150 to about 300 degrees Celsius.

9. The method of claim 1 further comprising wherein the metal gate layer comprises a thickness of at least about 75 angstroms.

10. The method of claim 1 further comprising wherein the polysilicon layer is formed at a temperature of about 500 to about 600 degrees Celsius.

11. A method comprising;
    forming a high k gate dielectric layer on a substrate, wherein the substrate comprises source/drain regions;
    forming a PMOS metal gate electrode on the high k gate dielectric layer, wherein the PMOS metal gate electrode comprises less than about 1 percent oxygen; and
    forming an amorphous polysilicon layer on the PMOS metal gate electrode, wherein the polysilicon layer is undoped, and wherein the PMOS metal gate electrode comprises a melting point greater than about 800 degrees Celsius.

12. The method of claim 11 further comprising wherein the PMOS metal gate electrode comprises at least one of tantalum nitride, titanium nitride, zirconium nitride, hafnium nitride, tantalum carbide, hafnium carbide and zirconium carbide.

13. The method of claim 11 further comprising wherein an inversion thin oxide formed beneath the high k gate oxide is below about 14 angstroms.

14. The method of claim 11 further comprising wherein the amorphous polysilicon layer and the PMOS metal gate electrode are formed in a cluster tool, and wherein there is no breaking of vacuum between the formation of the PMOS metal gate electrode and the formation of the amorphous polysilicon layer.

15. The method of claim 11 further comprising wherein the substrate comprises doped source/drain regions, and wherein the source drain regions are annealed at a temperature above about 800 degrees Celsius.

* * * * *